United States Patent
Holle et al.

(10) Patent No.: US 7,541,597 B2
(45) Date of Patent: Jun. 2, 2009

(54) AUTOMATIC CLEANING OF ION SOURCES

(75) Inventors: Armin Holle, Achim (DE); Gregor Przybyla, Bremen (DE)

(73) Assignee: Bruker Daltonik, GmbH, Bremen (DE)

( * ) Notice: Subject to any disclaimer, the term of this patent is extended or adjusted under 35 U.S.C. 154(b) by 229 days.

(21) Appl. No.: 11/559,086

(22) Filed: Nov. 13, 2006

(65) Prior Publication Data

US 2007/0114438 A1    May 24, 2007

(30) Foreign Application Priority Data

Nov. 16, 2005    (DE) .................. 10 2005 054 605

(51) Int. Cl.
*H01J 27/00*    (2006.01)
*H01J 37/08*    (2006.01)
*G21K 5/10*    (2006.01)

(52) U.S. Cl. .................. 250/423 R; 250/492.21; 250/492.3; 315/111.21; 315/111.81; 204/192.3; 204/192.34; 134/1.1; 216/67

(58) Field of Classification Search .......... 250/423 R, 250/424, 492.1, 492.21, 492.2, 492.3; 204/192.3, 204/192.34; 315/111.01, 111.21, 111.71, 315/111.81, 111.91; 216/67, 68, 69; 134/1, 134/1.1, 20; 313/362.1

See application file for complete search history.

(56) References Cited

U.S. PATENT DOCUMENTS

| 4,135,094 | A | * | 1/1979 | Hull ........................ 250/427 |
| 4,361,472 | A | * | 11/1982 | Morrison, Jr. ......... 204/192.12 |
| 4,434,038 | A | * | 2/1984 | Morrison, Jr. ......... 204/192.15 |
| 4,873,445 | A | * | 10/1989 | Le Jeune ............... 250/423 R |
| 6,464,891 | B1 | * | 10/2002 | Druz et al. .................. 216/67 |
| 2004/0163673 | A1 | * | 8/2004 | Holle et al. .................. 134/6 |
| 2006/0086376 | A1 | * | 4/2006 | Dimeo et al. .............. 134/22.1 |
| 2007/0114438 | A1 | * | 5/2007 | Holle et al. ............. 250/423 R |

* cited by examiner

*Primary Examiner*—Bernard E Souw
(74) *Attorney, Agent, or Firm*—Law Offices of Paul E. Kudirka

(57) ABSTRACT

The invention relates to the automatic cleaning of ion sources inside mass spectrometers, especially the cleaning of ion sources where the ions are generated by matrix-assisted laser desorption (MALDI).

The invention consists in cleaning the electrodes of the ion source, which are contaminated with organic material, in the mass spectrometer itself by etching with reactive ions produced by an electrically generated gas discharge in a specially admitted reactant gas.

11 Claims, 2 Drawing Sheets

AUTOMATIC CLEANING OF ION SOURCES

BACKGROUND

The invention relates to the automatic cleaning of ion sources inside mass spectrometers, especially the cleaning of ion sources in which the ions are generated by matrix-assisted laser desorption (MALDI).

Desorption ion sources, particularly ion sources for ionizing samples by matrix-assisted laser desorption (MALDI), are increasingly being used for the ionization of large molecules such as large biomolecules or synthetic polymers. At the same time, higher and higher sample throughput is being demanded, at least in some fields of application of molecular biology and medical diagnostic research. The sample support plates now usually hold 384, often even 1536 samples; the analytical method involves bombarding each sample with several hundred laser shots.

In MALDI ion sources, each bombardment of the samples, which contain large amounts of matrix substances in addition to the analyte substances, with the pulses of laser light, generates a plasma cloud, from which the ions formed are then withdrawn by switching on an accelerating field. In some cases, the plasma cloud also contains solid or liquid splash particles from the quasi-explosion of the matrix material. The plasma cloud expands further; part of the material (matrix substance and analyte substance) which is vaporized or splashed in this way is deposited on the accelerating electrodes in the process. After several hundred thousand shots, i.e. after the through passage of some ten to fifty sample support plates, each containing 384 samples, visible coatings have formed on these electrodes. These insulating coatings become electrically charged and interfere with the accelerating or focusing process for the ions. The coatings must therefore be removed.

Modern mass spectrometers are equipped with automatic feed systems for sample support plates. They can thus also work through the night or even over the weekend with thousands of samples. However, the contamination problem prevents these automatic feed systems being operated at full capacity.

The method used almost exclusively until now for removing this coating has been to clean the electrodes manually after venting and opening the ion source. The cleaning is usually carried out with solvents such as ethanol or acetone. After opening the ion source housing, it is generally possible to clean the first accelerating electrode without removing the ion source; but even then, cleaning and restoring a good vacuum takes several hours, and after the mass spectrometer has been started up again it must often be readjusted, and generally a complete recalibration of the mass scale from the flight times must be carried out. If the ion source has to be removed for cleaning, the method takes even longer and requires even more extensive adjustment.

A recent proposal (A. Holle, J. Franzen, DE 103 16 655.6) uses a specially designed cleaning plate having precisely the same shape as the sample support plate to clean the first accelerating electrode by spray-washing with solvent or brushing. It is not only the first accelerating electrode which is contaminated, however. More distant accelerating electrodes are also affected. The more distant accelerating electrodes stay uncontaminated for much longer, but when the instrument is in operation for a long time with high throughput, they too have to be cleaned.

Instead of the accelerating electrodes, this type of desorption ion source can also incorporate a set of guiding electrodes of a different type. The accelerating or guiding electrodes located in an ion source are grouped together under the term "ion source electrodes" below.

It is not only MALDI ion sources which have to be cleaned, however. In mass spectrometry, cleaning the ion sources is a process which has to be carried out for all types of internal ion sources and all types of mass spectrometers. The precise cleaning frequency is determined by the application but it almost always has to be done on a regular basis. The increased use of mass spectrometers by molecular biologists and medical professionals means that this is a process which constantly has to be carried out by the manufacturers' service technicians. A solution is therefore required which maximizes the automation of the cleaning without having to open the mass spectrometer and without requiring special technical skill.

SUMMARY

In accordance with the principles of the invention, the space around the ion source in the mass spectrometer is filled with a suitable reactant gas at a pressure of between one and 1000 Pascal and voltages are applied to the ion source electrodes or specially mounted auxiliary electrodes, which generate a so-called "cold", but highly reactive, plasma in the reactant gas by means of a self-consistent gas discharge. This plasma surrounds the ion source electrodes and etches away their impurities. RF voltages in the frequency range between 5 and 30 megahertz (shortwave range) and voltages of around three to ten kilovolts, preferably around five kilovolts, are usually used. A frequency of 13.57 megahertz is particularly favorable since this frequency is not used by communication services. The form and arrangement of the ion source electrodes inside the ion source must be designed to suit the purpose of a favorably formed and well-reactive plasma.

Reactive ions are formed in the plasma, which remove the organic impurities on the ion source electrodes by means of chemical reactions, usually by aggressive oxidation. The process is already used in other technical fields, where it is termed "reactive ion etching" or "plasma etching" (abbreviated to RIE). After the cleaning process, in which the organic impurities are decomposed to gaseous constituents such as carbon dioxide and water, the electric voltage is switched off and the gas, including the combustion gases from the impurities, is simply evacuated.

The reactant gas used can be clean (filtered and dried) air, for example, which is easy and economical, the oxygen ions performing the reactive ion etching. More favorable are higher proportions of oxygen, for example 95% oxygen, and a small proportion of heavier gases, for example 5% argon, in order to produce small amounts of sputtering, i.e. non-reactive ion etching, in addition to the reactive ion etching. Said sputtering primarily removes thin oxidation layers on the metal ion source electrodes. The oxidation layers can also, however, be removed by reduction, through the subsequent generation of a hydrogen plasma.

It is favorable (but not absolutely necessary) if the ion source can be separated, vacuum-wise, from the rest of the mass spectrometer since, in this case, the whole mass spectrometer does not have to be filled with reactant gas.

DETAILED DESCRIPTION

Figure 1:
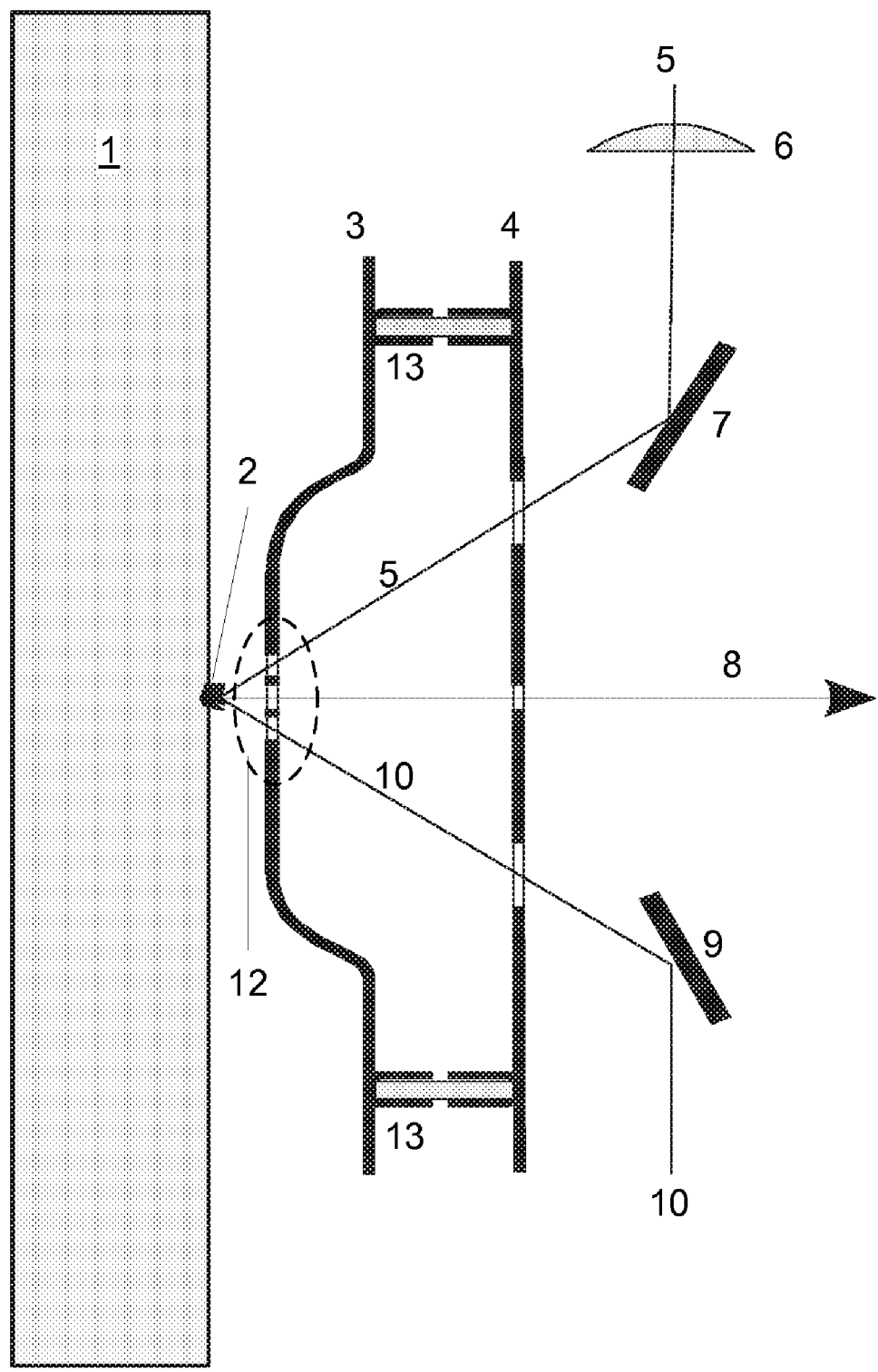
FIG. 1 illustrates an embodiment of an ion source for matrix-assisted laser desorption with a first (3) and a second accelerating electrode (4) in front of the sample support plate (1), which can be introduced and removed. The sample (2) is ionized by the laser beam (5); the beam of light (10) illuminates the sample, so that it can be imaged by a video camera (not shown).

While the invention has been shown and described with reference to a number of embodiments thereof, it will be recognized by those skilled in the art that various changes in form and detail may be made herein without departing from the spirit and scope of the invention as defined by the appended claims.

The invention relates to both methods and devices for cleaning ion source electrodes in ion sources located inside a mass spectrometer, especially ion source electrodes in ion sources with laser desorption.

The invention consists in filling the space around the ion source in the mass spectrometer with a suitable reactant gas at a pressure of between one and 1000 Pascal and applying voltages to the ion source electrodes which generate a plasma in the reactant gas by means of a glow discharge, said plasma surrounding the ion source electrodes and reactively cleaning them. It is favorable if the ion source is specially designed to make it easily accessible to the plasma. The size of the plasma cloud can be set, and restricted, to a large extent by the arrangement of the ion source electrodes and by the pressure of the reactant gas. At pressures in the region of around one Pascal, a plasma forms which more or less fills the whole chamber surrounding the ion source.

At a slightly higher pressure, the plasma contracts to the space surrounding the ion source if only one or more of its electrodes are supplied with the RF voltage. For every pressure there is an optimal separation between the electrodes for the formation of plasma which provides optimal cleaning. It is therefore possible to mount special auxiliary electrodes in the ion source which generate a favorable form of the plasma cloud. In particular, it is possible for a cleaning plate with a special shape (11), which has the outer contours of a normal sample support plate (1), to be introduced into the mass spectrometer as an auxiliary electrode, thus creating favorable separations between the ion source electrodes.

The gas discharge is preferably generated using RF voltages in the frequency range between 5 and 30 megahertz and with voltages of around three to ten kilovolts. Particularly favorable is a frequency of 13.57 megahertz since this frequency range is outside the frequency ranges used by telecommunication services and broadcasting companies and is available for such methods. Nevertheless, the European safety standards mean that the mass spectrometer with RF generator must be well screened when it is in operation. The relatively high voltage breaks down after the gas discharge has been ignited and is then largely dependent on the current. The plasma is largely neutral, i.e. the density of its positive ions, on the one hand, and its negative ions and electrons, on the other, is roughly equal. Since the plasma conducts, there is practically no electric field in the free plasma; the potential gradients are restricted to the areas very close to the electrodes (cathode drop).

The voltage required to ignite the discharge depends on the pressure of the reactant gas, and is also governed by the spacing between the ion source electrodes. When the gas discharge is ignited, the plasma is formed, and is maintained by a much lower voltage. On the one hand, however, the plasma is only maintained when the ions and, most importantly, the electrons can absorb so much energy within a mean free path that their kinetic energy in collisions is sufficient to ionize further molecules. On the other hand, the separation between two electrodes must be much greater that one mean free path because, otherwise, not enough ionizing collisions can occur. If the separation between two electrodes is very small, a gas discharge cannot ignite at a given gas pressure. There are optimal separations for the formation of dense plasmas; this optimal separation is dependent on the gas pressure.

The power of the RF generator depends on the size of the ion source and its electrodes; if the arrangement of the ion source electrodes is favorable and the power feed is good, with no large reflection losses, then cleaning only requires a generator power of approx. five to 20 Watts, of which only a small fraction is used to generate the plasma. A further part heats up the electrodes. The ion source electrodes should not begin to glow.

Gas mixtures which contain oxygen are usually used as the reactant gas. This causes reactive oxygen ions to be formed in the cold plasma, and these oxygen ions remove the organic impurities on the metal ion source electrodes reactively by aggressive oxidation. The reactant gas used can simply be cleanly filtered and dried air, for example, which is very economical. Normal indoor air can be filtered by a drying filter. The drying favors and accelerates the subsequent evacuation process, which proceeds more quickly when fewer water molecules have been deposited on the surfaces in the vacuum system.

More favorable are higher proportions of oxygen in the reactant gas mixture, however, for example 95% oxygen. The cleaning process then proceeds much more quickly and is finished in approx. two to ten minutes, or an even shorter time if the contamination is low. After the cleaning process, in which the impurities are decomposed to gaseous constituents, the electric voltage is switched off and the gas, including the decomposed impurities, is simply evacuated. The evacuation takes about a further 10 minutes, so that the overall cleaning process lasts a maximum of 20 minutes.

The high proportion of oxygen means that thin oxidation layers occasionally occur on some parts of the metal ion source electrodes. It is therefore favorable to admix a heavier gas, since this process causes slight sputtering in addition to the reactive ion etching and largely prevents the formation of oxidation layers. The sputter gas can be an admix of 5% argon, for example. After the cleaning process with oxygen ions it is also possible to generate a hydrogen plasma for a short time, which removes the oxidation layers by reduction.

It is particularly favorable if the ion source can be accommodated in a separate vacuum chamber which can be separated from the rest of the mass spectrometer by a valve, since in this case, the whole mass spectrometer does not have to be filled with reactant gas. If reference is made here to filling the ion source chamber with reactant gas, it is favorable for gas filling to be restricted to the ion source chamber alone. This can be achieved if the ion source chamber can be closed off from the rest of the mass spectrometer by a vacuum valve. If this is not the case, the reactant gas must be admitted to the complete mass spectrometer. It is then particularly important that the plasma is restricted to the narrow region of the ion source by the shaping of the ion source electrodes and auxiliary electrodes and by the pressure of the reactant gas.

Since the formation of the plasma can be controlled to a large extent by the shape of the ion source electrodes and how they are arranged with respect to each other, it is favorable to design the ion source in accordance with these requirements. This means that a specially shaped cleaning plate can also be introduced into the mass spectrometer.

FIG. 1 illustrates an ion source for ionizing solid samples (2) on a sample support plate (1) by pulsed laser desorption (MALDI) in analytical operation. As is frequently the case, the ion source consists essentially of the sample support plate (1), which is at a high voltage, and only two other electrodes, namely the first accelerating electrode (3) and the, usually grounded, second accelerating electrode (4). The first accelerating electrode (3) frequently has a separation of only a few millimeters (for example three millimeters) from the sample support plate (1). The second accelerating electrode (4) generally has a greater separation to the first accelerating electrode (3), for example ten millimeters. If the electrodes (3) and (4) do not take the form of metal grids, they have several apertures for the passage of the ion beam (8), the laser beam (5), the light (10) from lighting equipment (not shown), and for observing the samples on the sample support plate with a video camera (not shown in FIG. 1, since this equipment is outside the image plane).

The first accelerating electrode (3) is attached by means of insulators (13) to the second, grounded accelerating electrode (4). In order that these insulators, which are usually made of a plastic, for example polyimide, cannot be corroded by the cleaning process, they are protected with metal sleeves, which are a close fit but do not touch the insulators, so that they prevent a gas discharge in the interior. The sleeves also prevent sputtered metal from being vapor deposited onto the insulators.

In analytical operation, the sample (2) on the sample support plate (1) is bombarded by a pulsed beam of laser light (5), the laser light beam being focused by a lens (6) and deflected by a mirror (7) onto the sample (2). The light beam (10) from lighting equipment is deflected via the mirror (9) onto the sample (2). The illuminated sample (2) can be observed with a video camera located outside the image plane. The laser light bombardment causes a vaporization plasma to form in the sample (2). The ions of this vaporization plasma are extracted to the first accelerating electrode (3) by a switched voltage difference after a brief propagation time and can be formed into an ion beam (8).

After several thousand samples have been analyzed, which requires several hundred thousand laser shots, impurities of vaporized or splashed matrix material from the samples occur in the contaminated area (12) of the first accelerating electrode (3), and to a lesser extent on the second accelerating electrode as well (4). These impurities are electrically non-conducting, and therefore become electrically charged and interfere with the electric accelerating fields. They must therefore to be removed.

Figure 2:
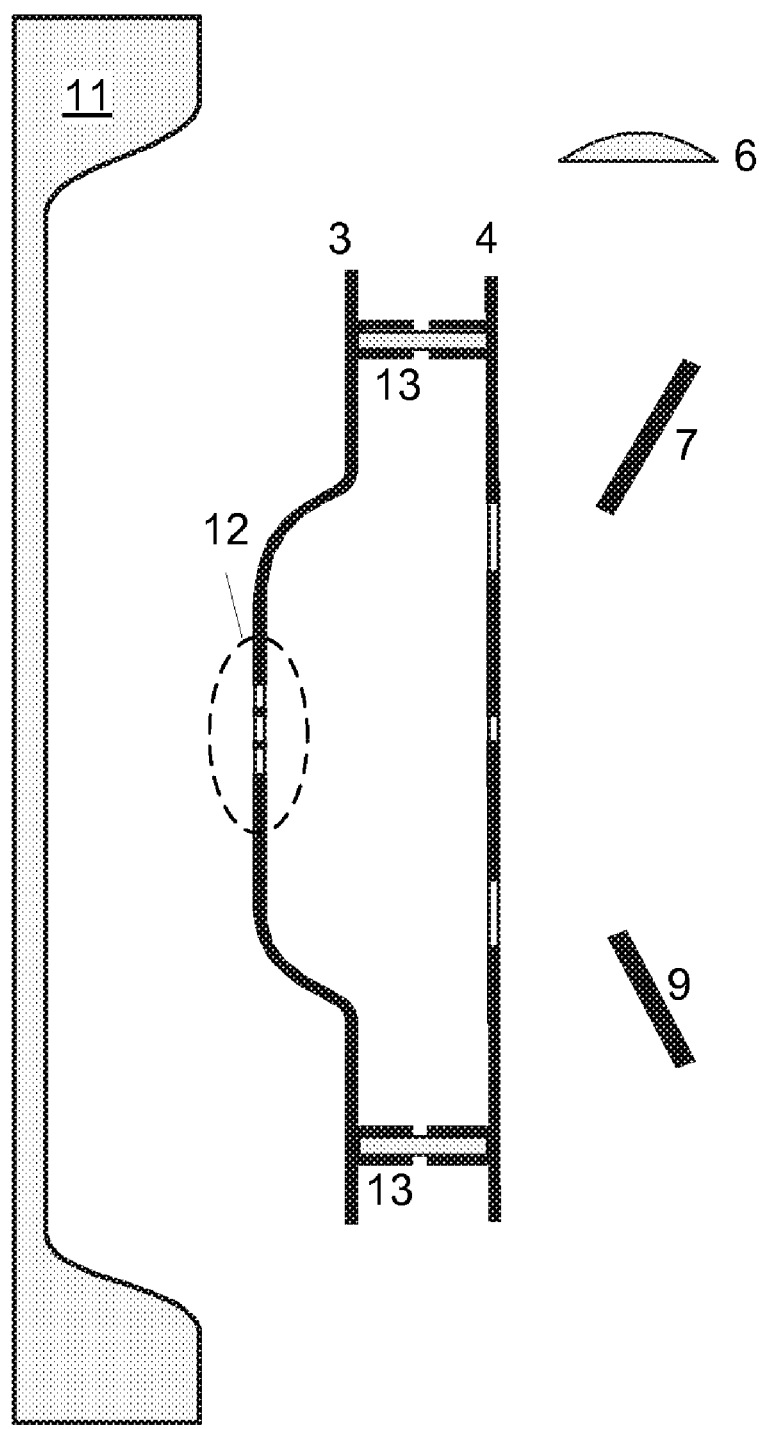
FIG. 2 represents the preparation for cleaning. A specially shaped cleaning plate (11) has been introduced instead of the sample support plate (1). This makes the distances from the center of contamination (12) of the first accelerating electrode (3) to the cleaning plate (11) and from the center of contamination (12) to the second accelerating electrode (4) roughly equal, which is important for the uniform formation of a plasma. The cleaning is accomplished by applying an RF voltage to the accelerating electrode (3) only, for example, while all the other electrodes are grounded. The insulators (13), which fix the first accelerating electrode to the, usually grounded, second accelerating electrode, are protected by metal sleeves, which are so closely spaced that no gas discharge can ignite and be maintained inside.

FIG. 2 shows the situation of the ion source in preparation of the automated cleaning process. In place of a sample support plate (1), a cleaning plate (11) with a special shape has now been introduced into the mass spectrometer. It is positioned so that the distance between it and the first accelerating electrode (3) is the same as the distance between the two electrodes (3) and (4). This creates the same combustion conditions for gas discharges between cleaning plate (11), first accelerating electrode (3) and second accelerating electrode (4).

After the cleaning plate (11) has been introduced, the reactant gas is admitted by opening a valve between a supply tank and the ion source housing. A choke in the supply lead provides for a controlled inflow, which in conjunction with the suction power of the vacuum pump creates the desired reactant gas pressure in the ion source chamber. The optimal pressure must be determined once and can then always be maintained.

To clean the ion source electrodes in the arrangement shown in FIG. 2, only one phase of the RF voltage is required. This is connected to the accelerating electrode (3). The power connections need special attention to avoid most of the RF power simply being reflected and fed back into the generator. It is favorable to select a coaxial cable with a suitable capacitance and a termination with the correct resistance. The design of the cleaning plate also plays an important role here. A triangular power connection to the accelerating electrode (3) can assist in preventing reflections of the RF voltage.

It is, of course, possible that completely different factors are important in determining the design of the ion source and its electrodes. Moreover, additional rules for working with electrically generated plasmas must be observed. For example, there should be no large blind holes in the ion source electrodes because self-sustained glow discharges can form there (hollow cathode discharges).

The insulator columns, which support the ion source electrodes, also have to be protected in a particular way. If the insulators are made of ceramic they must be protected against vapor deposition of conductive material from cathode sputtering and against deposition of carbon layers which sometimes occur in the plasma. If they are made of plastic, for example polyimide, they have to be protected against the corrosion caused by the reactant gas ions. Both of these requirements can be achieved by extensively enclosing the insulating columns on both sides in metal sleeves which closely surround the insulator columns. Inside the sleeves there is no electric field, and no plasma is actively generated there, even though a small number of reactive ions can still penetrate. The sleeves should be so close together that the gap is smaller than the minimum ignition and discharge length for gas discharges.

The cleaning process is controlled via a cleaning control program, which can be started by the operator of the mass spectrometer. It can also be started automatically, however, for example via the information in a transponder incorporated into the cleaning plate, which can be read by a reader station of the mass spectrometer. This makes it possible to stack the cleaning plates together with normal sample support plates and to automatically feed them to the mass spectrometer as part of a series of sample support plates using feed robots. It is therefore possible for the ion source electrodes to be cleaned automatically each time a predetermined number of sample support plates (each containing 384 or 1536 samples, for example) have been analyzed, for example in high throughput analyses which run over a weekend.

The special cleaning plates can incorporate a machine-readable identification code for this purpose, using a transponder or a printed barcode, for example, as can also be incorporated into normal sample supports. The information content of the code can then be read in a reader station of the mass spectrometer. This information can then be used by the control program of the mass spectrometer to call and execute a special cleaning control program. Reactant gas at the correct pressure is then automatically admitted, the RF voltage to ignite and then maintain the gas discharge is switched on and switched off again after a set time, and finally the ion source chamber is evacuated again after the feed of the reactant gas has been switched off.

The cleaning plates can also incorporate one or more movable or fixed, flat or curved mirrors, which can be used to check the cleaning effect using the video system of the mass spectrometer. The images of the ion source electrodes can be stored for subsequent checks.

If the cleaning process is started manually, the check can be done visually by the operator, who examines the image on the screen. It is also possible to automate the checking by using an image evaluation program. In particular, it is then possible to document the cleaning in images.

What is claimed is:

1. A method for cleaning ion source electrodes in a mass spectrometer by plasma etching, the mass spectrometer having a desorption ion source with the ion source electrodes located in a space in which a vacuum is present during ion source operation, the method comprising:
   (a) constructing the ion source electrodes with an arrangement and a position that supports formation of a plasma in the space;
   (b) admitting a reactant gas is into the space around the ion source electrodes, and
   (c) igniting a gas discharge in the reactant gas by applying to at least one of the ion source electrodes an electric voltage having characteristics that differ from characteristics of a voltage used to operate the ion source.

2. The method according to claim 1, wherein the electric voltage is an RF alternating voltage.

3. The method according to claim 2, wherein the electric alternating voltage has a frequency of substantially 13.57 megahertz.

4. The method according to claim 1, wherein the reactant gas is maintained at a preselected pressure of between 1 and 1000 Pascal.

5. The method according to claim 1, wherein the reactant gas contains oxygen for forming ions that act on organic materials to reactively decompose them.

6. The method according to claim 1, wherein the reactant gas contains a proportion of a heavy gas for forming ions that act by sputtering.

7. The method according to claim 1, wherein a special cleaning plate is positioned adjacent to the ion source electrodes in order to clean the ion source electrodes, wherein the shape of the cleaning plate contributes to the formation of the gas discharge.

8. The method according to claim 7, wherein the cleaning plate incorporates a machine-readable code which can be read by a mechanism in the mass spectrometer.

9. The method according to claim 8, further comprising automatically starting the cleaning method when the mechanism reads the machine-readable code.

10. The method according to claim 1, further comprising using a video system associated with the mass spectrometer to visually monitor the cleaning process.

11. A mass spectrometer comprising:
   an ion source having electrodes surrounded by a chamber, in which a vacuum is present during ion source operation, the electrodes being constructed with an arrangement and a position that supports formation of a plasma in the chamber;
   a device to admit a reactant gas into the chamber surrounding the ion source electrodes, and
   an electrical power supply connected to at least one of the ion source electrodes for applying to the at least one electrode an electric voltage having characteristics that differ from characteristics of a voltage used to operate the ion source in order to generate a gas discharge wherein ions produced by the gas discharge clean the ion source electrodes by plasma etching.

* * * * *